(12) United States Patent
Taipale

(10) Patent No.: US 11,545,951 B2
(45) Date of Patent: Jan. 3, 2023

(54) METHODS AND SYSTEMS FOR DETECTING AND MANAGING AMPLIFIER INSTABILITY

(71) Applicant: Cirrus Logic International Semiconductor Ltd., Edinburgh (GB)

(72) Inventor: Dana J. Taipale, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 149 days.

(21) Appl. No.: 16/851,468

(22) Filed: Apr. 17, 2020

(65) Prior Publication Data

US 2021/0175869 A1 Jun. 10, 2021

Related U.S. Application Data

(60) Provisional application No. 62/944,426, filed on Dec. 6, 2019.

(51) Int. Cl.
| | |
|---|---|
| *H03F 1/34* | (2006.01) |
| *H03G 11/06* | (2006.01) |
| *H03F 3/50* | (2006.01) |
| *H03G 11/00* | (2006.01) |
| *G10K 9/13* | (2006.01) |

(52) U.S. Cl.
CPC ............ *H03G 11/06* (2013.01); *G10K 9/13* (2013.01); *H03F 3/50* (2013.01); *H03G 11/008* (2013.01)

(58) Field of Classification Search
CPC ........ H03G 11/06; H03G 11/008; H03G 3/30; G10K 9/13; H03F 3/50; H03F 1/08; G01R 31/28; G01R 1/04; B06B 1/0276; B06B 2201/70; G06F 3/016

USPC ................. 330/129, 136, 285, 290
See application file for complete search history.

(56) References Cited

U.S. PATENT DOCUMENTS

| | | | |
|---|---|---|---|
| 3,686,927 A | 8/1972 | Scharton | |
| 4,902,136 A | 2/1990 | Mueller et al. | |
| 5,374,896 A * | 12/1994 | Sato ...................... | H03F 1/3247 330/136 |
| 5,684,722 A | 11/1997 | Thorner et al. | |
| 5,748,578 A | 5/1998 | Schell | |
| 5,857,986 A | 1/1999 | Moriyasu | |
| 6,050,393 A | 4/2000 | Murai et al. | |
| 6,278,790 B1 | 8/2001 | Davis et al. | |

(Continued)

FOREIGN PATENT DOCUMENTS

| | | |
|---|---|---|
| AU | 2002347829 | 4/2003 |
| CN | 103165328 A | 6/2013 |

(Continued)

OTHER PUBLICATIONS

Invitation to Pay Additional Fees, Partial International Search Report and Provisional Opinion of the International Searching Authority, International Application No. PCT/US2020/052537, dated Jan. 14, 2021.

(Continued)

*Primary Examiner* — Khanh V Nguyen
(74) *Attorney, Agent, or Firm* — Jackson Walker L.L.P.

(57) ABSTRACT

A system may include a first input for receiving a first signal for driving an amplifier that drives a load, a second input for receiving a second signal driven by the amplifier, and an instability detector for detecting instability of a feedback loop for controlling the first signal based on comparison of the first signal and the second signal.

17 Claims, 8 Drawing Sheets

(56) References Cited

U.S. PATENT DOCUMENTS

| | | | |
|---|---|---|---|
| 6,294,891 B1 | 9/2001 | McConnell et al. | |
| 6,332,029 B1 | 12/2001 | Azima et al. | |
| 6,388,520 B2 | 5/2002 | Wada et al. | |
| 6,567,478 B2* | 5/2003 | Oishi | H04J 1/00 |
| | | | 332/162 |
| 6,580,796 B1 | 6/2003 | Kuroki | |
| 6,683,437 B2 | 1/2004 | Tierling | |
| 6,703,550 B2 | 3/2004 | Chu | |
| 6,762,745 B1 | 7/2004 | Braun et al. | |
| 6,768,779 B1* | 7/2004 | Nielsen | H03F 3/217 |
| | | | 375/297 |
| 6,784,740 B1* | 8/2004 | Tabatabaei | H03F 1/223 |
| | | | 330/136 |
| 6,906,697 B2 | 6/2005 | Rosenberg | |
| 6,995,747 B2 | 2/2006 | Casebolt et al. | |
| 7,042,286 B2* | 5/2006 | Meade | H03F 1/3247 |
| | | | 330/136 |
| 7,154,470 B2 | 12/2006 | Tierling | |
| 7,277,678 B2* | 10/2007 | Rozenblit | H03F 1/0211 |
| | | | 330/149 |
| 7,333,604 B2 | 2/2008 | Zernovizky et al. | |
| 7,392,066 B2 | 6/2008 | Hapamas | |
| 7,456,688 B2* | 11/2008 | Okazaki | H03F 1/32 |
| | | | 330/107 |
| 7,623,114 B2 | 11/2009 | Rank | |
| 7,639,232 B2 | 12/2009 | Grant et al. | |
| 7,777,566 B1* | 8/2010 | Drogi | H03F 3/24 |
| | | | 330/136 |
| 7,791,588 B2 | 9/2010 | Tierling et al. | |
| 7,979,146 B2 | 7/2011 | Ullrich et al. | |
| 8,068,025 B2 | 11/2011 | Devenyi et al. | |
| 8,098,234 B2 | 1/2012 | Lacroix et al. | |
| 8,102,364 B2 | 1/2012 | Tierling | |
| 8,325,144 B1 | 12/2012 | Tierling et al. | |
| 8,427,286 B2 | 4/2013 | Grant et al. | |
| 8,441,444 B2 | 5/2013 | Moore et al. | |
| 8,466,778 B2 | 6/2013 | Hwang et al. | |
| 8,480,240 B2 | 7/2013 | Kashiyama | |
| 8,572,293 B2 | 10/2013 | Cruz-Hernandez et al. | |
| 8,572,296 B2 | 10/2013 | Shasha et al. | |
| 8,593,269 B2 | 11/2013 | Grant et al. | |
| 8,648,659 B2* | 2/2014 | Oh | H03F 1/0266 |
| | | | 330/285 |
| 8,648,829 B2 | 2/2014 | Shahoian et al. | |
| 8,659,208 B1 | 2/2014 | Rose et al. | |
| 8,754,757 B1 | 6/2014 | Ullrich et al. | |
| 8,947,216 B2 | 2/2015 | Da Costa et al. | |
| 8,981,915 B2 | 3/2015 | Birnbaum et al. | |
| 8,994,518 B2 | 3/2015 | Gregorio et al. | |
| 9,030,428 B2 | 5/2015 | Fleming | |
| 9,063,570 B2 | 6/2015 | Weddle et al. | |
| 9,070,856 B1 | 6/2015 | Rose et al. | |
| 9,083,821 B2 | 7/2015 | Hughes | |
| 9,092,059 B2 | 7/2015 | Bhatia | |
| 9,117,347 B2 | 8/2015 | Matthews | |
| 9,128,523 B2 | 9/2015 | Buuck et al. | |
| 9,164,587 B2 | 10/2015 | Da Costa et al. | |
| 9,196,135 B2 | 11/2015 | Shah et al. | |
| 9,248,840 B2 | 2/2016 | Truong | |
| 9,326,066 B2 | 4/2016 | Klippel | |
| 9,329,721 B1 | 5/2016 | Buuck et al. | |
| 9,354,704 B2 | 5/2016 | Lacroix et al. | |
| 9,368,005 B2 | 6/2016 | Cruz-Hernandez et al. | |
| 9,489,047 B2 | 11/2016 | Jiang et al. | |
| 9,495,013 B2 | 11/2016 | Underkoffler et al. | |
| 9,507,423 B2 | 11/2016 | Gandhi et al. | |
| 9,513,709 B2 | 12/2016 | Gregorio et al. | |
| 9,520,036 B1 | 12/2016 | Buuck | |
| 9,588,586 B2 | 3/2017 | Rihn | |
| 9,640,047 B2 | 5/2017 | Choi et al. | |
| 9,652,041 B2 | 5/2017 | Jiang et al. | |
| 9,696,859 B1 | 7/2017 | Heller et al. | |
| 9,697,450 B1 | 7/2017 | Lee | |
| 9,715,300 B2 | 7/2017 | Sinclair et al. | |
| 9,740,381 B1 | 8/2017 | Chaudhri et al. | |
| 9,842,476 B2 | 12/2017 | Rihn et al. | |
| 9,864,567 B2 | 1/2018 | Seo | |
| 9,881,467 B2 | 1/2018 | Levesque | |
| 9,886,829 B2 | 2/2018 | Levesque | |
| 9,946,348 B2 | 4/2018 | Ullrich et al. | |
| 9,947,186 B2 | 4/2018 | Macours | |
| 9,959,744 B2 | 5/2018 | Koskan et al. | |
| 9,965,092 B2 | 5/2018 | Smith | |
| 10,032,550 B1 | 7/2018 | Zhang et al. | |
| 10,055,950 B2 | 8/2018 | Saboune et al. | |
| 10,074,246 B2 | 9/2018 | Da Costa et al. | |
| 10,110,152 B1 | 10/2018 | Hajati | |
| 10,171,008 B2 | 1/2019 | Nishitani et al. | |
| 10,175,763 B2 | 1/2019 | Shah | |
| 10,191,579 B2 | 1/2019 | Forlines et al. | |
| 10,264,348 B1 | 4/2019 | Harris et al. | |
| 10,402,031 B2 | 9/2019 | Vandermeijden et al. | |
| 10,564,727 B2 | 2/2020 | Billington et al. | |
| 10,620,704 B2 | 4/2020 | Rand et al. | |
| 10,667,051 B2 | 5/2020 | Stahl | |
| 10,726,638 B2 | 7/2020 | Mondello et al. | |
| 10,735,956 B2 | 8/2020 | Bae et al. | |
| 10,782,785 B2 | 9/2020 | Hu et al. | |
| 10,795,443 B2 | 10/2020 | Hu et al. | |
| 10,820,100 B2 | 10/2020 | Stahl et al. | |
| 10,828,672 B2 | 11/2020 | Stahl et al. | |
| 10,832,537 B2 | 11/2020 | Doy et al. | |
| 10,848,886 B2 | 11/2020 | Rand | |
| 10,860,202 B2 | 12/2020 | Sepehr et al. | |
| 10,969,871 B2 | 4/2021 | Rand et al. | |
| 11,069,206 B2 | 7/2021 | Rao et al. | |
| 11,079,874 B2 | 8/2021 | Lapointe et al. | |
| 11,139,767 B2 | 10/2021 | Janko et al. | |
| 11,150,733 B2 | 10/2021 | Das et al. | |
| 11,259,121 B2 | 2/2022 | Lindemann et al. | |
| 2001/0043714 A1 | 11/2001 | Asada et al. | |
| 2002/0018578 A1 | 2/2002 | Burton | |
| 2002/0085647 A1 | 7/2002 | Oishi et al. | |
| 2003/0068053 A1 | 4/2003 | Chu | |
| 2003/0214485 A1 | 11/2003 | Roberts | |
| 2005/0031140 A1 | 2/2005 | Browning | |
| 2005/0134562 A1 | 6/2005 | Grant et al. | |
| 2006/0028095 A1 | 2/2006 | Maruyama et al. | |
| 2006/0197753 A1 | 9/2006 | Hotelling | |
| 2007/0024254 A1 | 2/2007 | Radecker et al. | |
| 2007/0241816 A1 | 10/2007 | Okazaki et al. | |
| 2008/0077367 A1 | 3/2008 | Odajima | |
| 2008/0167832 A1 | 7/2008 | Soss | |
| 2008/0226109 A1 | 9/2008 | Yamakata et al. | |
| 2008/0240458 A1 | 10/2008 | Goldstein et al. | |
| 2008/0293453 A1 | 11/2008 | Atlas et al. | |
| 2008/0316181 A1 | 12/2008 | Nurmi | |
| 2009/0020343 A1 | 1/2009 | Rothkopf et al. | |
| 2009/0079690 A1 | 3/2009 | Watson et al. | |
| 2009/0088220 A1 | 4/2009 | Persson | |
| 2009/0096632 A1 | 4/2009 | Ullrich et al. | |
| 2009/0102805 A1 | 4/2009 | Meijer et al. | |
| 2009/0128306 A1 | 5/2009 | Luden et al. | |
| 2009/0153499 A1 | 6/2009 | Kim et al. | |
| 2009/0189867 A1 | 7/2009 | Krah | |
| 2009/0278819 A1 | 11/2009 | Goldenberg et al. | |
| 2009/0313542 A1 | 12/2009 | Cruz-Hernandez et al. | |
| 2010/0013761 A1 | 1/2010 | Birnbaum et al. | |
| 2010/0080331 A1 | 4/2010 | Garudadri et al. | |
| 2010/0085317 A1 | 4/2010 | Park et al. | |
| 2010/0141408 A1 | 6/2010 | Doy et al. | |
| 2010/0141606 A1 | 6/2010 | Bae et al. | |
| 2010/0260371 A1 | 10/2010 | Afshar | |
| 2010/0261526 A1 | 10/2010 | Anderson et al. | |
| 2011/0056763 A1 | 3/2011 | Tanase et al. | |
| 2011/0075835 A1 | 3/2011 | Hill | |
| 2011/0077055 A1 | 3/2011 | Pakula et al. | |
| 2011/0141052 A1 | 6/2011 | Bernstein et al. | |
| 2011/0161537 A1 | 6/2011 | Chang | |
| 2011/0163985 A1 | 7/2011 | Bae et al. | |
| 2011/0167391 A1 | 7/2011 | Momeyer et al. | |
| 2012/0001436 A1 | 1/2012 | Jinkinson et al. | |
| 2012/0112894 A1 | 5/2012 | Yang et al. | |

(56) References Cited

U.S. PATENT DOCUMENTS

| | | |
|---|---|---|
| 2012/0206246 A1 | 8/2012 | Cruz-Hernandez et al. |
| 2012/0206247 A1 | 8/2012 | Bhatia et al. |
| 2012/0229264 A1 | 9/2012 | Company Bosch et al. |
| 2012/0249462 A1 | 10/2012 | Flanagan et al. |
| 2012/0253698 A1 | 10/2012 | Cokonaj |
| 2012/0306631 A1 | 12/2012 | Hughes |
| 2013/0016855 A1 | 1/2013 | Lee et al. |
| 2013/0027359 A1 | 1/2013 | Schevin et al. |
| 2013/0038792 A1 | 2/2013 | Quigley et al. |
| 2013/0096849 A1 | 4/2013 | Campbell et al. |
| 2013/0141382 A1 | 6/2013 | Simmons et al. |
| 2013/0275058 A1 | 10/2013 | Awad |
| 2013/0289994 A1 | 10/2013 | Newman et al. |
| 2014/0056461 A1 | 2/2014 | Afshar |
| 2014/0064516 A1 | 3/2014 | Cruz-Hernandez et al. |
| 2014/0079248 A1 | 3/2014 | Short et al. |
| 2014/0085064 A1 | 3/2014 | Crawley et al. |
| 2014/0118125 A1 | 5/2014 | Bhatia |
| 2014/0118126 A1 | 5/2014 | Garg et al. |
| 2014/0119244 A1 | 5/2014 | Steer et al. |
| 2014/0139327 A1 | 5/2014 | Bau et al. |
| 2014/0222377 A1 | 8/2014 | Bitan et al. |
| 2014/0226068 A1 | 8/2014 | Lacroix et al. |
| 2014/0292501 A1 | 10/2014 | Lim et al. |
| 2014/0340209 A1 | 11/2014 | Lacroix et al. |
| 2014/0347176 A1 | 11/2014 | Modarres et al. |
| 2015/0061846 A1 | 3/2015 | Yliaho |
| 2015/0070149 A1 | 3/2015 | Cruz-Hernandez et al. |
| 2015/0070151 A1 | 3/2015 | Cruz-Hernandez et al. |
| 2015/0070154 A1 | 3/2015 | Levesque et al. |
| 2015/0070260 A1 | 3/2015 | Saboune et al. |
| 2015/0084752 A1 | 3/2015 | Heubel et al. |
| 2015/0130767 A1 | 5/2015 | Myers et al. |
| 2015/0208189 A1 | 7/2015 | Tsai |
| 2015/0216762 A1 | 8/2015 | Oohashi et al. |
| 2015/0234464 A1 | 8/2015 | Yliaho |
| 2015/0324116 A1 | 11/2015 | Marsden et al. |
| 2015/0325116 A1 | 11/2015 | Umminger, III |
| 2015/0341714 A1 | 11/2015 | Ahn et al. |
| 2015/0356981 A1 | 12/2015 | Johnson et al. |
| 2016/0004311 A1 | 1/2016 | Yliaho |
| 2016/0007095 A1 | 1/2016 | Lacroix |
| 2016/0063826 A1 | 3/2016 | Morrell et al. |
| 2016/0070392 A1 | 3/2016 | Wang et al. |
| 2016/0074278 A1 | 3/2016 | Muench et al. |
| 2016/0097662 A1 | 4/2016 | Chang et al. |
| 2016/0132118 A1 | 5/2016 | Park et al. |
| 2016/0162031 A1 | 6/2016 | Westerman et al. |
| 2016/0179203 A1 | 6/2016 | Modarres |
| 2016/0187987 A1 | 6/2016 | Ullrich et al. |
| 2016/0239089 A1 | 8/2016 | Taninaka et al. |
| 2016/0246378 A1 | 8/2016 | Sampanes et al. |
| 2016/0277821 A1 | 9/2016 | Kunimoto |
| 2016/0291731 A1 | 10/2016 | Liu et al. |
| 2016/0328065 A1 | 11/2016 | Johnson et al. |
| 2016/0358605 A1 | 12/2016 | Ganong, III et al. |
| 2017/0052593 A1 | 2/2017 | Jiang et al. |
| 2017/0078804 A1 | 3/2017 | Guo et al. |
| 2017/0083096 A1 | 3/2017 | Rihn et al. |
| 2017/0090572 A1 | 3/2017 | Holenarsipur et al. |
| 2017/0090573 A1 | 3/2017 | Hajati et al. |
| 2017/0153760 A1 | 6/2017 | Chawda et al. |
| 2017/0168574 A1 | 6/2017 | Zhang |
| 2017/0169674 A1 | 6/2017 | Macours |
| 2017/0180863 A1 | 6/2017 | Biggs et al. |
| 2017/0220197 A1 | 8/2017 | Matsumoto et al. |
| 2017/0256145 A1 | 9/2017 | Macours et al. |
| 2017/0031495 A1 | 12/2017 | Tse |
| 2017/0357440 A1 | 12/2017 | Tse |
| 2018/0021811 A1 | 1/2018 | Kutej et al. |
| 2018/0059733 A1 | 3/2018 | Gault et al. |
| 2018/0059793 A1 | 3/2018 | Hajati |
| 2018/0067557 A1 | 3/2018 | Robert et al. |
| 2018/0074637 A1 | 3/2018 | Rosenberg et al. |
| 2018/0082673 A1 | 3/2018 | Tzanetos |
| 2018/0084362 A1 | 3/2018 | Zhang et al. |
| 2018/0095596 A1 | 4/2018 | Turgeman |
| 2018/0151036 A1 | 5/2018 | Cha et al. |
| 2018/0158289 A1 | 6/2018 | Vasilev et al. |
| 2018/0159452 A1 | 6/2018 | Eke et al. |
| 2018/0159457 A1 | 6/2018 | Eke |
| 2018/0159545 A1 | 6/2018 | Eke et al. |
| 2018/0160227 A1 | 6/2018 | Lawrence et al. |
| 2018/0165925 A1 | 6/2018 | Israr et al. |
| 2018/0178114 A1 | 6/2018 | Mizuta et al. |
| 2018/0182212 A1 | 6/2018 | Li et al. |
| 2018/0183372 A1 | 6/2018 | Li et al. |
| 2018/0196567 A1 | 7/2018 | Klein et al. |
| 2018/0206282 A1 | 7/2018 | Singh et al. |
| 2018/0224963 A1 | 8/2018 | Lee et al. |
| 2018/0237033 A1 | 8/2018 | Hakeem et al. |
| 2018/0253123 A1 | 9/2018 | Levesque et al. |
| 2018/0255411 A1 | 9/2018 | Lin et al. |
| 2018/0267897 A1 | 9/2018 | Jeong |
| 2018/0294757 A1 | 10/2018 | Feng et al. |
| 2018/0301060 A1 | 10/2018 | Israr et al. |
| 2018/0321748 A1 | 11/2018 | Rao et al. |
| 2018/0323725 A1 | 11/2018 | Cox et al. |
| 2018/0329172 A1 | 11/2018 | Tabuchi |
| 2018/0335848 A1 | 11/2018 | Moussette et al. |
| 2018/0367897 A1 | 12/2018 | Bjork et al. |
| 2019/0020760 A1 | 1/2019 | DeBates et al. |
| 2019/0035235 A1 | 1/2019 | Da Costa et al. |
| 2019/0227628 A1 | 1/2019 | Rand et al. |
| 2019/0044651 A1 | 2/2019 | Nakada |
| 2019/0051229 A1 | 2/2019 | Ozguner et al. |
| 2019/0064925 A1 | 2/2019 | Kim et al. |
| 2019/0069088 A1 | 2/2019 | Seiler |
| 2019/0073078 A1 | 3/2019 | Sheng et al. |
| 2019/0102031 A1 | 4/2019 | Shutzberg et al. |
| 2019/0103829 A1 | 4/2019 | Vasudevan et al. |
| 2019/0138098 A1 | 5/2019 | Shah |
| 2019/0163234 A1 | 5/2019 | Kim et al. |
| 2019/0196596 A1 | 6/2019 | Yokoyama et al. |
| 2019/0206396 A1 | 7/2019 | Chen |
| 2019/0215349 A1 | 7/2019 | Adams et al. |
| 2019/0220095 A1 | 7/2019 | Ogita et al. |
| 2019/0228619 A1 | 7/2019 | Yokoyama et al. |
| 2019/0114496 A1 | 8/2019 | Lesso |
| 2019/0235629 A1 | 8/2019 | Hu et al. |
| 2019/0294247 A1 | 9/2019 | Hu et al. |
| 2019/0296674 A1 | 9/2019 | Janko et al. |
| 2019/0297418 A1 | 9/2019 | Stahl |
| 2019/0305851 A1 | 10/2019 | Vegas-Olmos et al. |
| 2019/0311590 A1 | 10/2019 | Doy et al. |
| 2019/0341903 A1 | 11/2019 | Kim |
| 2019/0384393 A1 | 12/2019 | Cruz-Hernandez et al. |
| 2020/0117506 A1 | 4/2020 | Chan |
| 2020/0139403 A1 | 5/2020 | Palit |
| 2020/0150767 A1 | 5/2020 | Karimi Eskandary et al. |
| 2020/0218352 A1 | 7/2020 | Macours et al. |
| 2020/0313529 A1 | 10/2020 | Lindemann et al. |
| 2020/0313654 A1 | 10/2020 | Marchais et al. |
| 2020/0314969 A1 | 10/2020 | Marchais et al. |
| 2020/0401292 A1 | 12/2020 | Lorenz et al. |
| 2020/0403546 A1 | 12/2020 | Janko et al. |
| 2021/0108975 A1 | 4/2021 | Parada et al. |
| 2021/0125469 A1 | 4/2021 | Alderson |
| 2021/0153562 A1 | 5/2021 | Fishwick et al. |
| 2021/0157436 A1 | 5/2021 | Parada et al. |
| 2021/0174777 A1 | 6/2021 | Marchais et al. |
| 2021/0175869 A1 | 6/2021 | Taipale |
| 2021/0200316 A1 | 7/2021 | Das et al. |
| 2021/0325967 A1 | 10/2021 | Khenkin et al. |
| 2021/0328535 A1 | 10/2021 | Khenkin et al. |
| 2021/0365118 A1 | 11/2021 | Rajapurkar et al. |
| 2022/0026989 A1 | 1/2022 | Rao et al. |

FOREIGN PATENT DOCUMENTS

| | | |
|---|---|---|
| CN | 103403796 A | 11/2013 |
| CN | 204903757 U | 12/2015 |
| CN | 105264551 A | 1/2016 |
| CN | 106438890 A | 2/2017 |

(56) References Cited

FOREIGN PATENT DOCUMENTS

| | | |
|---|---|---|
| CN | 106950832 A | 7/2017 |
| CN | 107665051 A | 2/2018 |
| CN | 210628147 U | 5/2020 |
| CN | 114237414 A | 3/2022 |
| EP | 0784844 B1 | 6/2005 |
| EP | 2306269 A1 | 4/2011 |
| EP | 2363785 A1 | 9/2011 |
| EP | 2487780 A1 | 8/2012 |
| EP | 2600225 A1 | 6/2013 |
| EP | 2846218 A1 | 3/2015 |
| EP | 2846229 A2 | 3/2015 |
| EP | 2846329 A1 | 3/2015 |
| EP | 2988528 A1 | 2/2016 |
| EP | 3125508 A1 | 2/2017 |
| EP | 3379382 A1 | 9/2018 |
| GB | 201620746 A | 1/2017 |
| IN | 201747044027 | 8/2018 |
| JP | H02130433 B2 | 5/1990 |
| JP | 08149006 A | 6/1996 |
| JP | H10184782 A | 7/1998 |
| JP | 6026751 B2 | 11/2016 |
| JP | 6250985 | 12/2017 |
| JP | 6321351 | 5/2018 |
| KR | 20120126446 A | 11/2012 |
| WO | 2013104919 A1 | 7/2013 |
| WO | 2013186845 A1 | 12/2013 |
| WO | 2014018086 A1 | 1/2014 |
| WO | 2014094283 A1 | 6/2014 |
| WO | 2016105496 A1 | 6/2016 |
| WO | 2016164193 A1 | 10/2016 |
| WO | 2017113651 A1 | 7/2017 |
| WO | 2018053159 A1 | 3/2018 |
| WO | 2018067613 A1 | 4/2018 |
| WO | 2018125347 A1 | 7/2018 |
| WO | 2020004840 A1 | 1/2020 |
| WO | 2020055405 A1 | 3/2020 |

OTHER PUBLICATIONS

International Search Report and Written Opinion of the International Searching Authority, International Application No. PCT/US2020/056610, dated Jan. 21, 2021.
International Search Report and Written Opinion of the International Searching Authority, International Application No. PCT/GB2020/052537, dated Mar. 9, 2021.
First Examination Opinion Notice, State Intellectual Property Office of the People's Republic of China, Application No. 201880037435.X, dated Dec. 31, 2020.
International Search Report and Written Opinion of the International Searching Authority, International Application No. PCT/GB2020/051035, dated Jul. 10, 2020.
International Search Report and Written Opinion of the International Searching Authority, International Application No. PCT/GB2020/050823, dated Jun. 30, 2020.
International Search Report and Written Opinion of the International Searching Authority, International Application No. PCT/US2020/024864, dated Jul. 6, 2020.
International Search Report and Written Opinion of the International Searching Authority, International Application No. PCT/GB2020/051037, dated Jul. 9, 2020.
Communication Relating to the Results of the Partial International Search, and Provisional Opinion Accompanying the Partial Search Result, of the International Searching Authority, International Application No. PCT/GB2020/050822, dated Jul. 9, 2020.
International Search Report and Written Opinion of the International Searching Authority, International Application No. PCT/GB2019/052991, dated Mar. 17, 2020, received by Applicant Mar. 19, 2020.
International Search Report and Written Opinion of the International Searching Authority, International Application No. PCT/GB2019/023342, dated Jun. 9, 2020.
International Search Report and Written Opinion of the International Searching Authority, International Application No. PCT/GB2020/050822, dated Aug. 31, 2020.
International Search Report and Written Opinion of the International Searching Authority, International Application No. PCT/GB2020/051438, dated Sep. 28, 2020.
Office Action of the Intellectual Property Office, ROC (Taiwan) Patent Application No. 107115475, dated Apr. 30, 2021.
First Office Action, China National Intellectual Property Administration, Patent Application No. 2019800208570, dated Jun. 3, 2021.
International Search Report and Written Opinion of the International Searching Authority, International Application No. PCT/US2021/021908, dated Jun. 9, 2021.
Notice of Preliminary Rejection, Korean Intellectual Property Office, Application No. 10-2019-7036236, dated Jun. 29, 2021.
Combined Search and Examination Report, United Kingdom Intellectual Property Office, Application No. GB2018051.9, dated Jun. 30, 2021.
Communication pursuant to Rule 164(2)(b) and Article 94(3) EPC, European Patent Office, Application No. 18727512.8, dated Jul. 8, 2021.
Gottfried Behler: "Measuring the Loudspeaker's Impedance during Operation for the Derivation of the Voice Coil Temperature", AES Convention Preprint, Feb. 25, 1995 (Feb. 25, 1995), Paris.
First Office Action, China National Intellectual Property Administration, Patent Application No. 2019800211287, dated Jul. 5, 2021.
International Search Report and Written Opinion of the International Searching Authority, International Application No. PCT/GB2019/050964, dated Sep. 3, 2019.
International Search Report and Written Opinion of the International Searching Authority, International Application No. PCT/GB2019/050770, dated Jul. 5, 2019.
Communication Relating to the Results of the Partial International Search, and Provisional Opinion Accompanying the Partial Search Result, of the International Searching Authority, International Application No. PCT/US2018/031329, dated Jul. 20, 2018.
Combined Search and Examination Report, UKIPO, Application No. GB1720424.9, dated Jun. 5, 2018.
Steinbach et al., Haptic Data Compression and Communication, IEEE Signal Processing Magazine, Jan. 2011.
Pezent et al., Syntacts Open-Source Software and Hardware for Audio-Controlled Haptics, IEEE Transactions on Haptics, vol. 14, No. 1, Jan.-Mar. 2021.
Danieau et al., Enhancing Audiovisual Experience with Haptic Feedback: A Survey on HAV, IEEE Transactions on Haptics, vol. 6, No. 2, Apr.-Jun. 2013.
Danieau et al., Toward Haptic Cinematography: Enhancing Movie Experiences with Camera-Based Haptic Effects, IEEE Computer Society, IEEE MultiMedia, Apr.-Jun. 2014.
Jaijongrak et al., A Haptic and Auditory Assistive User Interface: Helping the Blinds on their Computer Operations, 2011 IEEE International Conference on Rehabilitation Robotics, Rehab Week Zurich, ETH Zurich Science City, Switzerland, Jun. 29-Jul. 1, 2011.
Lim et al., An Audio-Haptic Feedbacks for Enhancing User Experience in Mobile Devices, 2013 IEEE International Conference on Consumer Electronics (ICCE).
Weddle et al., How Does Audio-Haptic Enhancement Influence Emotional Response to Mobile Media, 2013 Fifth International Workshop on Quality of Multimedia Experience (QoMEX), QMEX 2013.
Examination Report under Section 18(3), United Kingdom Intellectual Property Office, Application No. GB2018051.9, dated Nov. 5, 2021.
Final Notice of Preliminary Rejection, Korean Patent Office, Application No. 10-2019-7036236, dated Nov. 29, 2021.
Examination Report under Section 18(3), United Kingdom Intellectual Property Office, Application No. GB2018050.1, dated Dec. 22, 2021.
Second Office Action, National Intellectual Property Administration, PRC, Application No. 2019800208570, dated Jan. 19, 2022.
Examination Report under Section 18(3), United Kingdom Intellectual Property Office, Application No. GB2106247.6, dated Mar. 31, 2022.

(56) References Cited

OTHER PUBLICATIONS

Examination Report under Sections 17 and 18(3), UKIPO, Application No. GB2112207.2, dated Aug. 18, 2022.
International Search Report and Written Opinion of the International Searching Authority, International Application No. PCT/US2022/030541, dated Sep. 1, 2022.
Vanderborght, B. et al., Variable impedance actuators: A review; Robotics and Autonomous Systems 61, Aug. 6, 2013, pp. 1601-1614.
International Search Report and Written Opinion of the International Searching Authority, International Application No. PCT/US2022/033190, dated Sep., 2022.
International Search Report and Written Opinion of the International Searching Authority, International Application No. PCT/US2022/033230, dated Sep. 15, 2022.
Combined Search and Examination Report under Sections 17 and 18(3), UKIPO, Application No. GB2210174.5, dated Aug. 1, 2022.
Communication pursuant to Article 94(3) EPC, European Patent Application No. 18727512.8, dated Sep. 26, 2022.
Examination Report under Sections 17 and 18(3), UKIPO, Application No. GB2115048.7, dated Aug. 24, 2022.

\* cited by examiner

METHODS AND SYSTEMS FOR DETECTING AND MANAGING AMPLIFIER INSTABILITY

RELATED APPLICATION

The present disclosure claims priority to U.S. Provisional Patent Application Ser. No. 62/944,426, filed Dec. 6, 2019, which is incorporated by reference herein in its entirety.

FIELD OF DISCLOSURE

The present disclosure relates in general to detecting instability in an amplifier, such as an amplifier used to drive a haptic vibrational load, and the management of such instability.

BACKGROUND

Vibro-haptic transducers, for example linear resonant actuators (LRAs), are widely used in portable devices such as mobile phones to generate vibrational feedback to a user. Vibro-haptic feedback in various forms creates different feelings of touch to a user's skin, and may play increasing roles in human-machine interactions for modern devices.

An LRA may be modelled as a mass-spring electromechanical vibration system. When driven with appropriately designed or controlled driving signals, an LRA may generate certain desired forms of vibrations. For example, a sharp and clear-cut vibration pattern on a user's finger may be used to create a sensation that mimics a mechanical button click. This clear-cut vibration may then be used as a virtual switch to replace mechanical buttons.

FIG. 1 illustrates an example of a vibro-haptic system in a device 100. Device 100 may comprise a controller 101 configured to control a signal applied to an amplifier 102. Amplifier 102 may then drive a haptic transducer 103 based on the signal. Controller 101 may be triggered by a trigger to output to the signal. The trigger may for example comprise a pressure or force sensor on a screen or virtual button of device 100.

Among the various forms of vibro-haptic feedback, tonal vibrations of sustained duration may play an important role to notify the user of the device of certain predefined events, such as incoming calls or messages, emergency alerts, and timer warnings, etc. In order to generate tonal vibration notifications efficiently, it may be desirable to operate the haptic actuator at its resonance frequency.

The resonance frequency $f_0$ of a haptic transducer may be approximately estimated as:

$$f_0 = \frac{1}{2*\pi*\sqrt{C*M}} \quad (1)$$

where C is the compliance of the spring system, and M is the equivalent moving mass, which may be determined based on both the actual moving part in the haptic transducer and the mass of the portable device holding the haptic transducer.

Due to sample-to-sample variations in individual haptic transducers, mobile device assembly variations, temporal component changes caused by aging, component changes caused by self-heating, and use conditions such as various different strengths of a user gripping of the device, the vibration resonance of the haptic transducer may vary from time to time.

FIG. 2A illustrates an example of a linear resonant actuator (LRA) modelled as a linear system including a mass-spring system 201. LRAs are non-linear components that may behave differently depending on, for example, the voltage levels applied, the operating temperature, and the frequency of operation. However, these components may be modelled as linear components within certain conditions.

FIG. 2B illustrates an example of an LRA modelled as a linear system, including an electrically equivalent model of mass-spring system 201 of LRA. In this example, the LRA is modelled as a third order system having electrical and mechanical elements. In particular, Re and Le are the DC resistance and coil inductance of the coil-magnet system, respectively; and Bl is the magnetic force factor of the coil. The driving amplifier outputs the voltage waveform V(t) with the output impedance Ro. The terminal voltage $V_T(t)$ may be sensed across the terminals of the haptic transducer. The mass-spring system 201 moves with velocity u(t).

An electromagnetic load such as an LRA may be characterized by its impedance $Z_{LRA}$ as seen as the sum of a coil impedance $Z_{coil}$ and a mechanical impedance $Z_{mech}$:

$$Z_{LRA} = Z_{coil} + Z_{mech} \quad (2)$$

Coil impedance $Z_{coil}$ may in turn comprise a direct current (DC) resistance Re in series with an inductance Le:

$$Z_{coil} = Re + s*Le \quad (3)$$

Mechanical impedance $Z_{mech}$ may be defined by three parameters including the resistance at resonance $R_{RES}$ representing an electrical resistance representative of mechanical friction of the mass-spring system of the haptic transducer, a capacitance $C_{MES}$ representing an electrical capacitance representative of an equivalent moving mass M of the mass-spring system of the haptic transducer, and inductance $L_{CES}$ representative of a compliance C of the mass-spring system of the haptic transducer. The electrical equivalent of the total mechanical impedance is the parallel connection of $R_{RES}$, $C_{MES}$, $L_{CES}$. The Laplace transform of this parallel connection is described by:

$$Z_{mech}(s) = \frac{1}{\left(\frac{1}{R_{RES}} + \frac{1}{L_{CES}*s} + C_{MES}*s\right)} \quad (4)$$

The resonant frequency $f_0$ of the haptic transducer can be represented as:

$$f_0 = \frac{1}{\left(2*\pi*\sqrt{L_{CES}*C_{MES}}*\right)} \quad (5)$$

The quality factor Q of the LRA can be represented as:

$$Q = \frac{R_{RES} + Re}{R_{RES} + Re} * \sqrt{\frac{C_{MES}}{L_{CES}}} \quad (6)$$

Referring to equation (6), it may appear non-intuitive that the expression involves a subexpression describing the parallel connection of resistances Re and $$R_{RES} \left(\text{i.e.,} \frac{R_{RES}*Re}{R_{RES}+Re}\right)$$

while in FIG. 2B these resistances are shown in a series connection. However, such may be the case where a driving voltage Ve is oscillating but then abruptly turns off and goes to zero. The voltage amplifier shown in FIG. 2B may be considered to have a low source impedance, ideally zero source impedance. Under these conditions, when driving voltage Ve goes to zero, the voltage amplifier effectively disappears from the circuit. At that point, the top-most terminal of resistance Re in FIG. 2B is grounded as is the bottom-most terminal of resistance $R_{RES}$, and so resistances Re and $R_{RES}$ are indeed connected in parallel as reflected in equation (6).

Electromagnetic transducers, such as LRAs or microspeakers, may have slow response times. FIG. 3 is a graph of an example response of an LRA, depicting an example driving signal to the LRA, a current through the LRA, and a back electromotive force (back EMF) of the LRA, wherein such back EMF may be proportional to the velocity of a moving element (e.g., coil or magnet) of the transducer. As shown in FIG. 3, the attack time of the back EMF may be slow as energy is transferred to the LRA, and some "ringing" of the back EMF may occur after the driving signal has ended as the mechanical energy stored in the LRA is discharged. In the context of a haptic LRA, such behavioral characteristic may result in a "mushy" feeling click or pulse, instead of a "crisp" tactile response. Thus, it may be desirable for an LRA to instead have a response similar to that shown in FIG. 4, in which there exists minimal ringing after the driving signal has ended, and which may provide a more "crisp" tactile response in a haptic context. Accordingly, it may be desirable to apply processing to a driving signal such that when the processed driving signal is applied to the transducer, the velocity or back EMF of the transducer more closely approaches that of FIG. 4.

SUMMARY

In accordance with the teachings of the present disclosure, the disadvantages and problems associated with detecting and managing instability in an amplifier may be reduced or eliminated.

In accordance with embodiments of the present disclosure, a method may include receiving a first signal for driving an amplifier that drives a load, receiving a second signal driven by the amplifier, and detecting instability of a feedback loop for controlling the first signal based on comparison of the first signal and the second signal.

In accordance with these and other embodiments of the present disclosure, a system may include a first input for receiving a first signal for driving an amplifier that drives a load, a second input for receiving a second signal driven by the amplifier, and an instability detector for detecting instability of a feedback loop for controlling the first signal based on comparison of the first signal and the second signal.

In accordance with these and other embodiments of the present disclosure, a host device may include an amplifier that drives a load and a processing subsystem comprising a first input for receiving a first signal for driving an amplifier that drives a load, a second input for receiving a second signal driven by the amplifier, and an instability detector for detecting instability of a feedback loop for controlling the first signal based on comparison of the first signal and the second signal.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiment discussed below, and all such equivalents should be deemed as being encompassed by the present disclosure.

Various electronic devices or smart devices may have transducers, speakers, and acoustic output transducers, for example any transducer for converting a suitable electrical driving signal into an acoustic output such as a sonic pressure wave or mechanical vibration. For example, many electronic devices may include one or more speakers or loudspeakers for sound generation, for example, for playback of audio content, voice communications and/or for providing audible notifications.

Such speakers or loudspeakers may comprise an electromagnetic actuator, for example a voice coil motor, which is mechanically coupled to a flexible diaphragm, for example a conventional loudspeaker cone, or which is mechanically coupled to a surface of a device, for example the glass screen of a mobile device. Some electronic devices may also include acoustic output transducers capable of generating ultrasonic waves, for example for use in proximity detection type applications and/or machine-to-machine communication.

Many electronic devices may additionally or alternatively include more specialized acoustic output transducers, for example, haptic transducers, tailored for generating vibrations for haptic control feedback or notifications to a user. Additionally or alternatively, an electronic device may have a connector, e.g., a socket, for making a removable mating connection with a corresponding connector of an accessory apparatus, and may be arranged to provide a driving signal to the connector so as to drive a transducer, of one or more of the types mentioned above, of the accessory apparatus when connected. Such an electronic device will thus comprise driving circuitry for driving the transducer of the host device or connected accessory with a suitable driving signal. For acoustic or haptic transducers, the driving signal will generally be an analog time varying voltage signal, for example, a time varying waveform.

Figure 5:
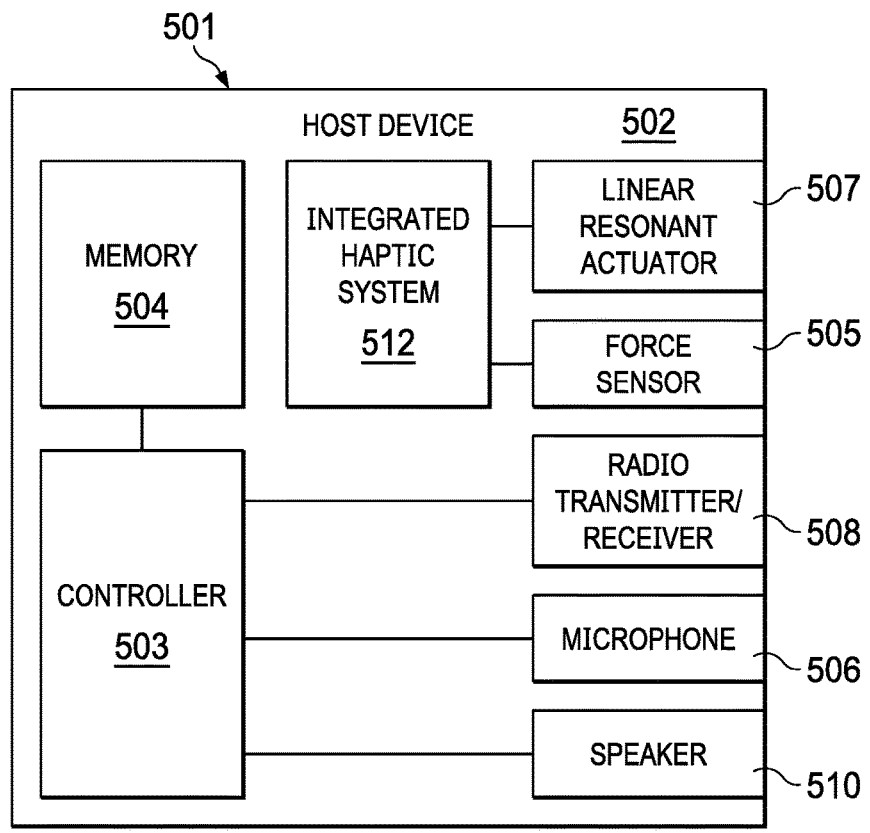
FIG. 5 illustrates a block diagram of selected components of an example mobile device, in accordance with embodiments of the present disclosure.

FIG. 5 illustrates a block diagram of selected components of an example host device 502, in accordance with embodiments of the present disclosure. As shown in FIG. 5, host device 502 may comprise an enclosure 501, a controller 503, a memory 504, a force sensor 505, a microphone 506, a linear resonant actuator 507, a radio transmitter/receiver 508, a speaker 510, and an integrated haptic system 512.

Enclosure 501 may comprise any suitable housing, casing, or other enclosure for housing the various components of host device 502. Enclosure 501 may be constructed from plastic, metal, and/or any other suitable materials. In addition, enclosure 501 may be adapted (e.g., sized and shaped) such that host device 502 is readily transported on a person of a user of host device 502. Accordingly, host device 502 may include but is not limited to a smart phone, a tablet computing device, a handheld computing device, a personal digital assistant, a notebook computer, a video game controller, or any other device that may be readily transported on a person of a user of host device 502.

Controller 503 may be housed within enclosure 501 and may include any system, device, or apparatus configured to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, controller 503 interprets and/or executes program instructions and/or processes data stored in memory 504 and/or other computer-readable media accessible to controller 503.

Memory 504 may be housed within enclosure 501, may be communicatively coupled to controller 503, and may include any system, device, or apparatus configured to retain program instructions and/or data for a period of time (e.g., computer-readable media). Memory 504 may include random access memory (RAM), electrically erasable programmable read-only memory (EEPROM), a Personal Computer Memory Card International Association (PCMCIA) card, flash memory, magnetic storage, opto-magnetic storage, or any suitable selection and/or array of volatile or non-volatile memory that retains data after power to host device 502 is turned off.

Microphone 506 may be housed at least partially within enclosure 501, may be communicatively coupled to controller 503, and may comprise any system, device, or apparatus configured to convert sound incident at microphone 506 to an electrical signal that may be processed by controller 503, wherein such sound is converted to an electrical signal using a diaphragm or membrane having an electrical capacitance that varies as based on sonic vibrations received at the diaphragm or membrane. Microphone 506 may include an electrostatic microphone, a condenser microphone, an electret microphone, a microelectromechanical systems (MEMs) microphone, or any other suitable capacitive microphone.

Radio transmitter/receiver 508 may be housed within enclosure 501, may be communicatively coupled to controller 503, and may include any system, device, or apparatus configured to, with the aid of an antenna, generate and transmit radio-frequency signals as well as receive radio-frequency signals and convert the information carried by such received signals into a form usable by controller 503. Radio transmitter/receiver 508 may be configured to transmit and/or receive various types of radio-frequency signals, including without limitation, cellular communications (e.g., 2G, 3G, 4G, LTE, etc.), short-range wireless communications (e.g., BLUETOOTH), commercial radio signals, television signals, satellite radio signals (e.g., GPS), Wireless Fidelity, etc.

A speaker 510 may be housed at least partially within enclosure 501 or may be external to enclosure 501, may be communicatively coupled to controller 503, and may comprise any system, device, or apparatus configured to produce sound in response to electrical audio signal input. In some embodiments, a speaker may comprise a dynamic loudspeaker, which employs a lightweight diaphragm mechanically coupled to a rigid frame via a flexible suspension that constrains a voice coil to move axially through a cylindrical magnetic gap. When an electrical signal is applied to the voice coil, a magnetic field is created by the electric current in the voice coil, making it a variable electromagnet. The coil and the driver's magnetic system interact, generating a mechanical force that causes the coil (and thus, the attached cone) to move back and forth, thereby reproducing sound under the control of the applied electrical signal coming from the amplifier.

Force sensor 505 may be housed within enclosure 501, and may include any suitable system, device, or apparatus for sensing a force, a pressure, or a touch (e.g., an interaction with a human finger) and generating an electrical or electronic signal in response to such force, pressure, or touch. In some embodiments, such electrical or electronic signal may be a function of a magnitude of the force, pressure, or touch applied to the force sensor. In these and other embodiments, such electronic or electrical signal may comprise a general purpose input/output (GPIO) signal associated with an input signal to which haptic feedback is given. Force sensor 505 may include, without limitation, a capacitive displacement sensor, an inductive force sensor (e.g., a resistive-inductive-capacitive sensor), a strain gauge, a piezoelectric force sensor, force sensing resistor, piezoelectric force sensor, thin film force sensor, or a quantum tunneling composite-based force sensor. For purposes of clarity and exposition in this disclosure, the term "force" as used herein may refer not only to force, but to physical quantities indicative of force or analogous to force, such as, but not limited to, pressure and touch.

Linear resonant actuator 507 may be housed within enclosure 501, and may include any suitable system, device, or apparatus for producing an oscillating mechanical force across a single axis. For example, in some embodiments, linear resonant actuator 507 may rely on an alternating current voltage to drive a voice coil pressed against a moving mass connected to a spring. When the voice coil is driven at the resonant frequency of the spring, linear resonant actuator 507 may vibrate with a perceptible force. Thus, linear resonant actuator 507 may be useful in haptic applications within a specific frequency range. While, for the purposes of clarity and exposition, this disclosure is described in relation to the use of linear resonant actuator 507, it is understood that any other type or types of vibrational actuators (e.g., eccentric rotating mass actuators) may be used in lieu of or in addition to linear resonant actuator 507. In addition, it is also understood that actuators arranged to produce an oscillating mechanical force across multiple axes may be used in lieu of or in addition to linear resonant actuator 507. As described elsewhere in this disclosure, a linear resonant actuator 507, based on a signal received from integrated haptic system 512, may render haptic feedback to a user of host device 502 for at least one of mechanical button replacement and capacitive sensor feedback.

Integrated haptic system 512 may be housed within enclosure 501, may be communicatively coupled to force sensor 505 and linear resonant actuator 507, and may include any system, device, or apparatus configured to receive a signal from force sensor 505 indicative of a force applied to host device 502 (e.g., a force applied by a human finger to a virtual button of host device 502) and generate an electronic signal for driving linear resonant actuator 507 in response to the force applied to host device 502. Detail of an example integrated haptic system in accordance with embodiments of the present disclosure is depicted in FIG. 6.

Although specific example components are depicted above in FIG. 5 as being integral to host device 502 (e.g., controller 503, memory 504, force sensor 505, microphone 506, radio transmitter/receiver 508, speakers(s) 510), a host device 502 in accordance with this disclosure may comprise one or more components not specifically enumerated above. For example, although FIG. 5 depicts certain user interface components, host device 502 may include one or more other user interface components in addition to those depicted in FIG. 5 (including but not limited to a keypad, a touch screen, and a display), thus allowing a user to interact with and/or otherwise manipulate host device 502 and its associated components.

Figure 6:
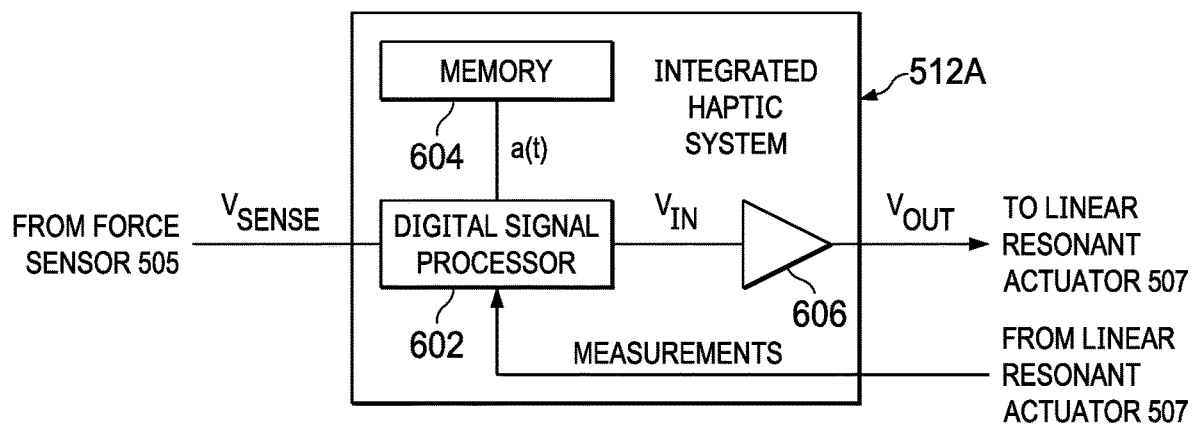
FIG. 6 illustrates a block diagram of selected components of an example integrated haptic system, in accordance with embodiments of the present disclosure.

FIG. 6 illustrates a block diagram of selected components of an example integrated haptic system 512A, in accordance with embodiments of the present disclosure. In some embodiments, integrated haptic system 512A may be used to implement integrated haptic system 512 of FIG. 5. As shown in FIG. 6, integrated haptic system 512A may include a digital signal processor (DSP) 602, a memory 604, and an amplifier 606.

DSP 602 may include any system, device, or apparatus configured to interpret and/or execute program instructions and/or process data. In some embodiments, DSP 602 may interpret and/or execute program instructions and/or process data stored in memory 604 and/or other computer-readable media accessible to DSP 602.

Memory 604 may be communicatively coupled to DSP 602, and may include any system, device, or apparatus configured to retain program instructions and/or data for a period of time (e.g., computer-readable media). Memory 604 may include random access memory (RAM), electrically erasable programmable read-only memory (EEPROM), a Personal Computer Memory Card International Association (PCMCIA) card, flash memory, magnetic storage, opto-magnetic storage, or any suitable selection and/or array of volatile or non-volatile memory that retains data after power to host device 502 is turned off.

Amplifier 606 may be electrically coupled to DSP 602 and may comprise any suitable electronic system, device, or apparatus configured to increase the power of an input signal $V_{IN}$ (e.g., a time-varying voltage or current) to generate an output signal $V_{OUT}$. For example, amplifier 606 may use electric power from a power supply (not explicitly shown) to increase the amplitude of a signal. Amplifier 606 may include any suitable amplifier class, including without limitation, a Class-D amplifier.

In operation, memory 604 may store one or more haptic playback waveforms. In some embodiments, each of the one or more haptic playback waveforms may define a haptic response a(t) as a desired acceleration of a linear resonant actuator (e.g., linear resonant actuator 507) as a function of time. DSP 602 may be configured to receive a force signal $V_{SENSE}$ indicative of force applied to force sensor 505. Either in response to receipt of force signal $V_{SENSE}$ indicating a sensed force or independently of such receipt, DSP 602 may retrieve a haptic playback waveform from memory 604 and process such haptic playback waveform to determine a processed haptic playback signal $V_{IN}$. In embodiments in which amplifier 606 is a Class D amplifier, processed haptic playback signal $V_{IN}$ may comprise a pulse-width modulated signal. In response to receipt of force signal $V_{SENSE}$ indicating a sensed force, DSP 602 may cause processed haptic playback signal $V_{IN}$ to be output to amplifier 606, and amplifier 606 may amplify processed haptic playback signal $V_{IN}$ to generate a haptic output signal $V_{OUT}$ for driving linear resonant actuator 507.

In some embodiments, integrated haptic system 512A may be formed on a single integrated circuit, thus enabling lower latency than existing approaches to haptic feedback control. By providing integrated haptic system 512A as part of a single monolithic integrated circuit, latencies between various interfaces and system components of integrated haptic system 512A may be reduced or eliminated.

Figure 1:
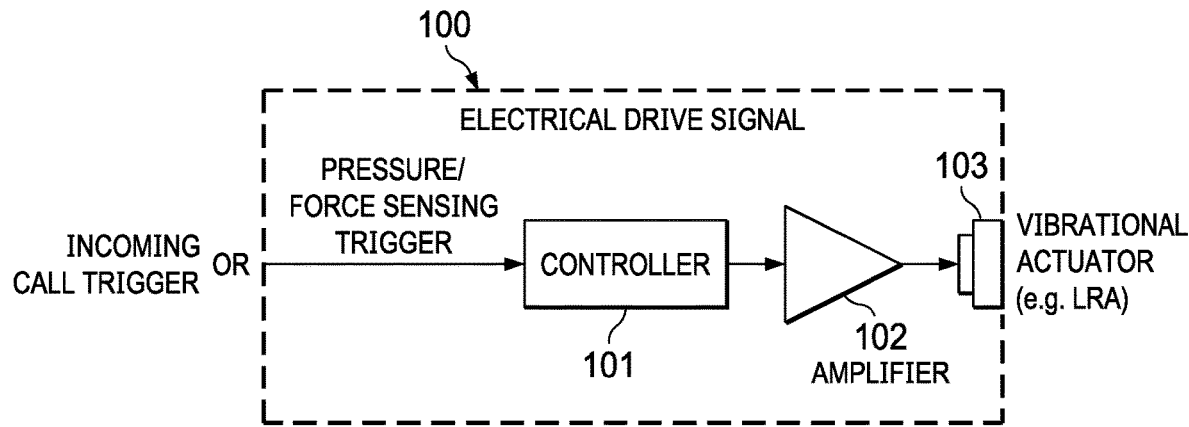
FIG. 1 illustrates an example of a vibro-haptic system in a device, as is known in the art.
Figure 2A:
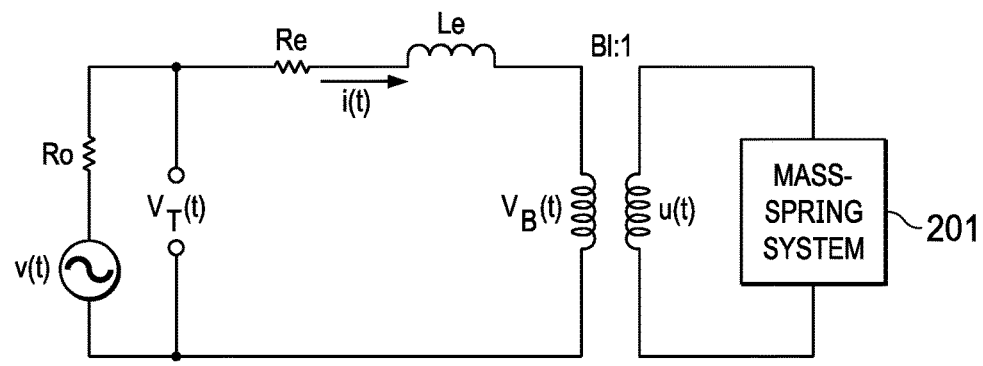
FIGS. 2A and 2B each illustrate an example of a Linear Resonant Actuator (LRA) modelled as a linear system, as is known in the art.
Figure 2B:
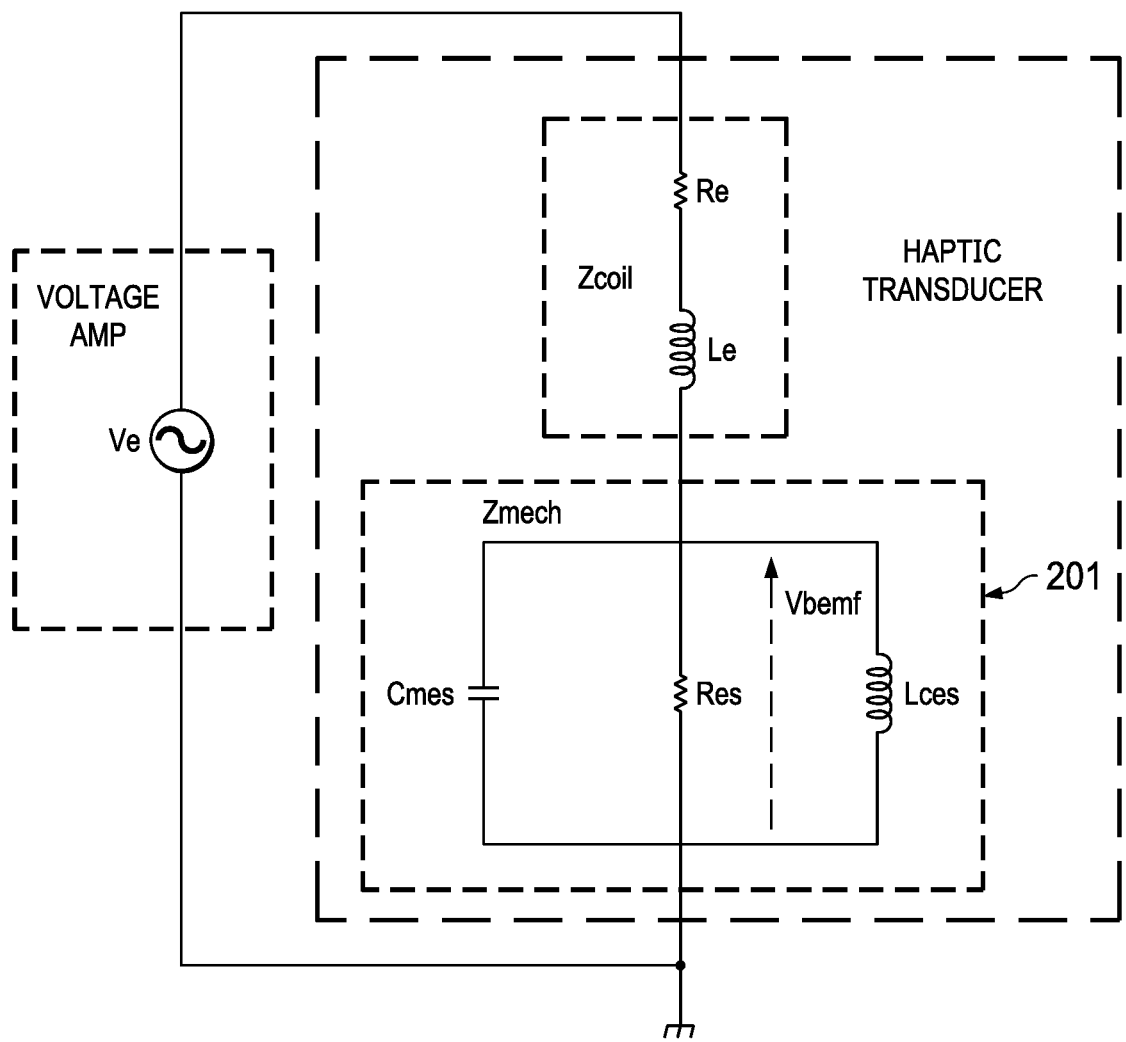
Figure 3:
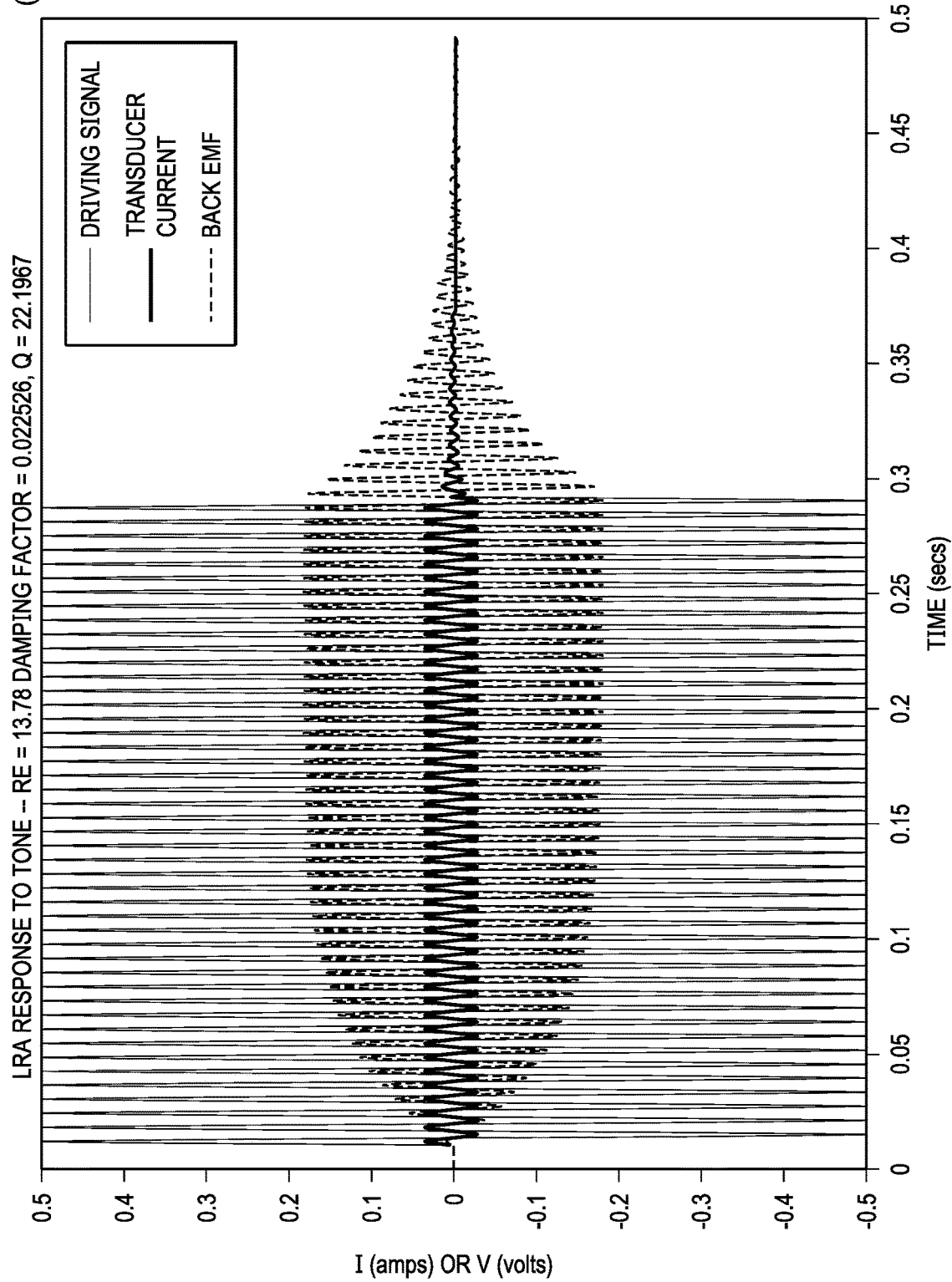
FIG. 3 illustrates a graph of example waveforms of an electromagnetic load, as is known in the art.
Figure 4:
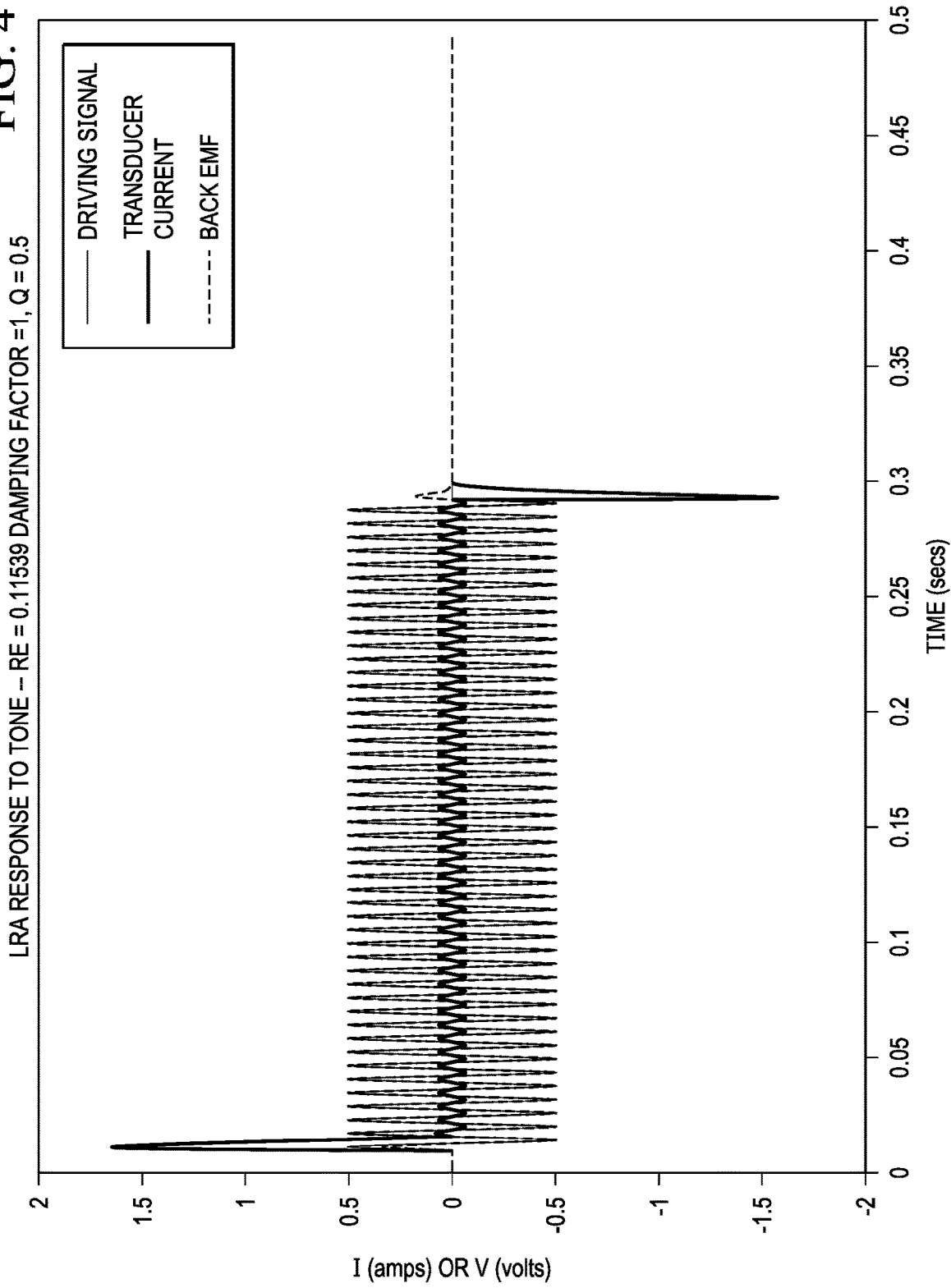
FIG. 4 illustrates a graph of desirable example waveforms of an electromagnetic load, in accordance with embodiments of the present disclosure.

The problem illustrated in FIG. 3 may result from a linear resonant actuator 507 with a high quality factor q with a sharp peak in impedance at a resonant frequency $f_0$ of linear resonant actuator 507.

Figure 7:
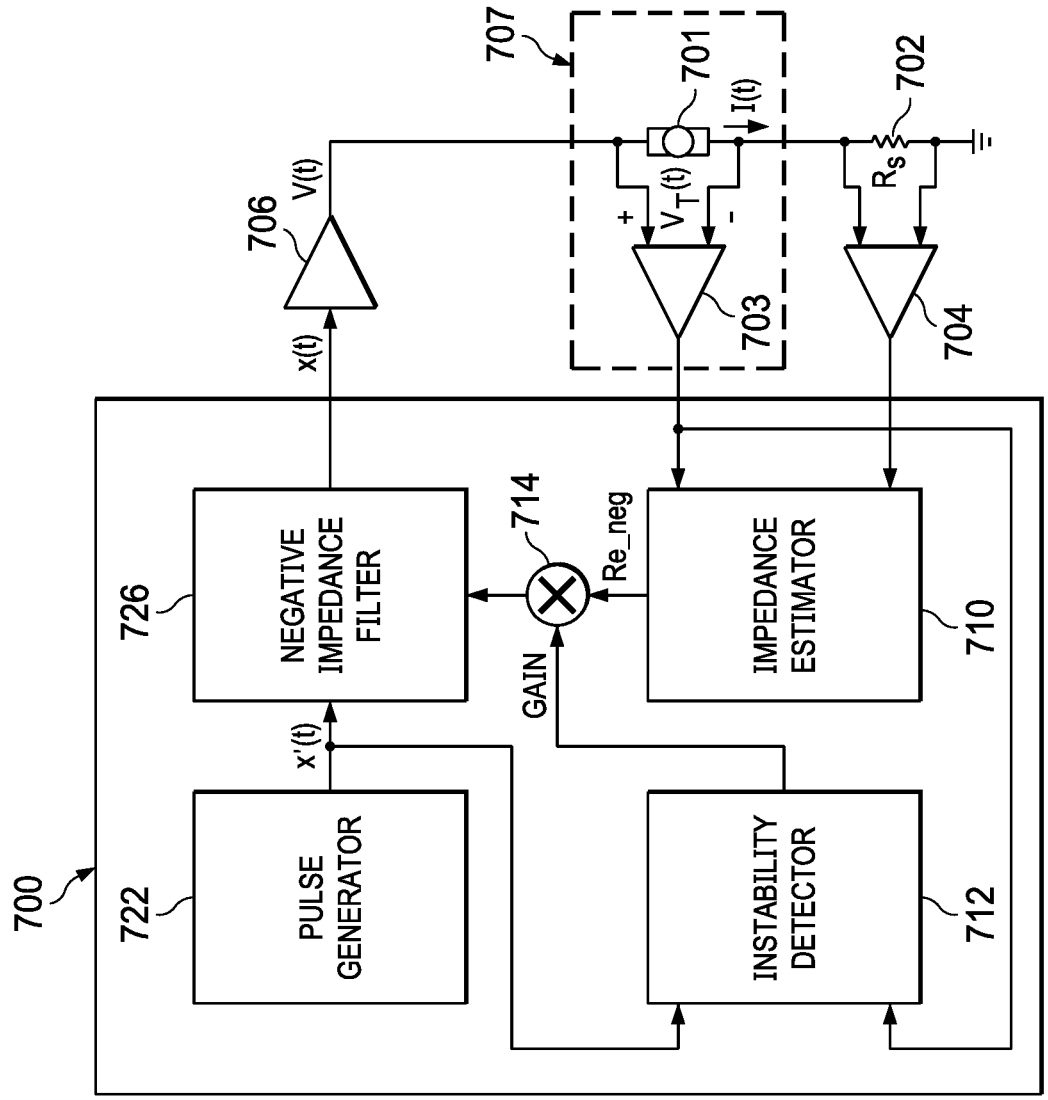
FIG. 7 illustrates an example system for improving transducer dynamics, in accordance with embodiments of the present disclosure.

FIG. 7 illustrates an example system 700 for improving dynamics of an electromagnetic load 701, in accordance with embodiments of the present disclosure. In some embodiments, system 700 may be integral to a host device (e.g., host device 502) comprising system 700 and electromagnetic load 701.

In operation, a pulse generator 722 of a system 700 of a host device may generate a raw transducer driving signal x'(t) (which, in some embodiments, may be a waveform signal, such as a haptic waveform signal or audio signal). In some embodiments, raw transducer driving signal x' (t) may be generated based on a desired playback waveform received by pulse generator 722.

Raw transducer driving signal x'(t) may be received by negative impedance filter 726 which, as described in greater detail below, may be applied to raw transducer driving signal x'(t) to reduce an effective quality factor q of the electromagnetic load 701, which may in turn decrease attack time and minimize ringing occurring after the raw transducer driving signal has ended, thus generating transducer driving signal x(t) to the output of negative impedance filter 726.

Transducer driving signal x(t) may in turn be amplified by amplifier 706 to generate a driving signal V(t) for driving electromagnetic load 701. Responsive to driving signal V(t), a sensed terminal voltage $V_T(t)$ of electromagnetic load 701 may be converted to a digital representation by a first analog-to-digital converter (ADC) 703. Similarly, sensed current I(t) may be converted to a digital representation by a second ADC 704. Current I(t) may be sensed across a shunt resistor 702 having resistance $R_s$ coupled to a terminal of electromagnetic load 701. The terminal voltage $V_T(t)$ may be sensed by a terminal voltage sensing block 707, for example a volt meter.

As shown in FIG. 7, system 700 may include an impedance estimator 710. Impedance estimator 710 may include any suitable system, device, or apparatus configured to estimate, based on sensed terminal voltage $V_T(t)$, sensed current I(t), and/or any other measured parameters of electromagnetic load 701, one or more components of the electrical and/or mechanical impedances of electromagnetic load 701, and generate one or more control signals (e.g., a negative impedance Re_neg) for controlling a response of negative impedance filter 726. Examples of approaches for estimating one or more components of the electrical and/or mechanical impedances of electromagnetic load 701 and generating a negative impedance value Re_neg are described in, without limitation, U.S. patent application Ser. No. 16/816,790 filed Mar. 12, 2020 and entitled "Methods and Systems for Improving Transducer Dynamics;" U.S. patent application Ser. No. 16/816,833 filed Mar. 12, 2020 and entitled "Methods and Systems for Estimating Transducer Parameters;" U.S. patent application Ser. No. 16/842,482 filed Apr. 7, 2020 and entitled "Thermal Model of Transducer for Thermal Protection and Resistance Estimation;" and U.S. patent application Ser. No. 16/369,556 filed Mar. 29, 2019 and entitled "Driver Circuitry;" all of which is incorporated by reference herein in their entireties.

As mentioned above and described in greater detail below, a system 700 may implement negative impedance filter 726 to apply to the raw transducer driving signal, which may reduce an effective quality factor q of the transducer, which may in turn decrease attack time and minimize ringing occurring after the raw transducer driving signal has ended. Quality factor q of a transducer may be expressed as:

$$q = \frac{R_{RES} * Re}{R_{RES} + Re} * \sqrt{\frac{C_{MES}}{L_{CES}}} \quad (7)$$

In equation (7), as DC resistance Re increases, the numerator term $R_{RES}*Re$ increases more rapidly than the denominator term $R_{RES}+Re$. Therefore, quality factor q generally increases with increasing DC resistance Re. Accordingly, one way system 700 may minimize quality factor q is to effectively decrease DC resistance Re. In some embodiments, system 700 may ideally decrease the effective DC resistance Re to a point in which critical damping occurs in electromagnetic load 701.

Figure 8:
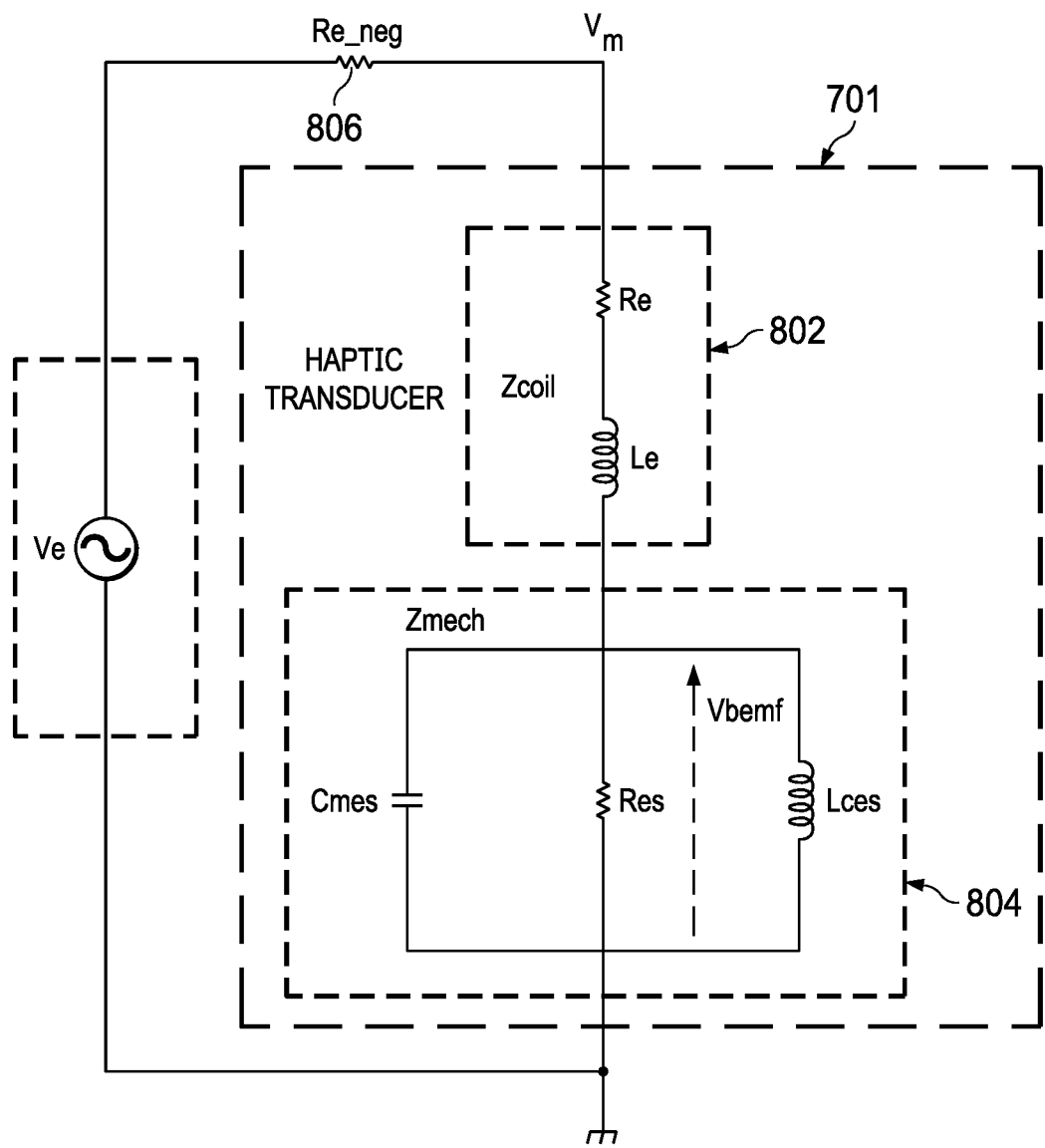
FIG. 8 illustrates an example of a linear resonant actuator (LRA) modelled as a linear system and including a negative resistance, in accordance with embodiments of the present disclosure.

Turning briefly to FIG. 8, FIG. 8 illustrates an example of electromagnetic load 701 modelled as a linear system including electrical components 802 and electrical model of mechanical components 804 and including a negative resistance resistor 806 with negative impedance Re_neg inserted in series with electromagnetic load 701, in accordance with embodiments of the present disclosure. The addition of negative impedance Re_neg may lower quality factor q because effectively it subtracts from DC resistance Re thereby reducing the overall DC electrical impedance.

In practice, negative resistors do not exist. Instead, negative impedance filter 726 may comprise a digital filter configured to behave substantially like the circuit shown in FIG. 8, including a mathematical model of negative impedance Re_neg in series with a mathematical model of electromagnetic load 701. In operation, negative impedance filter 726 may in effect compute a voltage $V_m$ that would occur at the junction of negative impedance Re_neg and DC resistance Re as shown in FIG. 8, if, in fact, it were possible to place a physical resistor with negative impedance Re_neg in series with electromagnetic load 701. Computed voltage $V_m$ may then be used to drive electromagnetic load 701.

In essence, system 700 implements a sensorless velocity control feedback loop for electromagnetic load 701. The feedback loop may use a dynamic estimate of parameters of electromagnetic load 701 and generate feedback (e.g., negative impedance Re_neg and the response of negative impedance filter 726) to cancel most of the electrical and mechanical impedance of electromagnetic load 701. The electrical and mechanical impedance of electromagnetic load 701 may change in response to the stimulus applied to it (e.g., amplitude and frequency of driving signal V(t)), ambient temperature conditions, and/or other factors.

In order for impedance cancellation performed by the feedback loop to be effective, most of the impedance of electromagnetic load 701 should be cancelled (e.g., from 95% to just under 100% of the impedance of electromagnetic load 701). However, when the feedback loop cancels almost all of the impedance of electromagnetic load 701, instability of the feedback loop may result, for example if the impedance to be cancelled is incorrectly estimated.

Thus, turning back to FIG. 7, to balance the effectiveness of reducing quality factor q with prevention of instability in the feedback loop, system 700 may include an instability detector 712 to detect instability and, when instability is detected, reduce (at least temporarily) the amount of the impedance of electromagnetic load 701 cancelled in order to prevent instability.

In the feedback loop depicted in FIG. 7, instability may be defined as a condition in which output to electromagnetic load 701, which may be indicated by sensed terminal voltage $V_T(t)$, does not correlate with raw transducer driving signal x'(t). Accordingly, instability detector 712 may receive sensed terminal voltage $V_T(t)$ and raw transducer driving signal x'(t) as inputs, although in some embodiments instability detector 712 may monitor sensed current 40 in addition to or in lieu of sensed terminal voltage $V_T(t)$.

Figure 9:
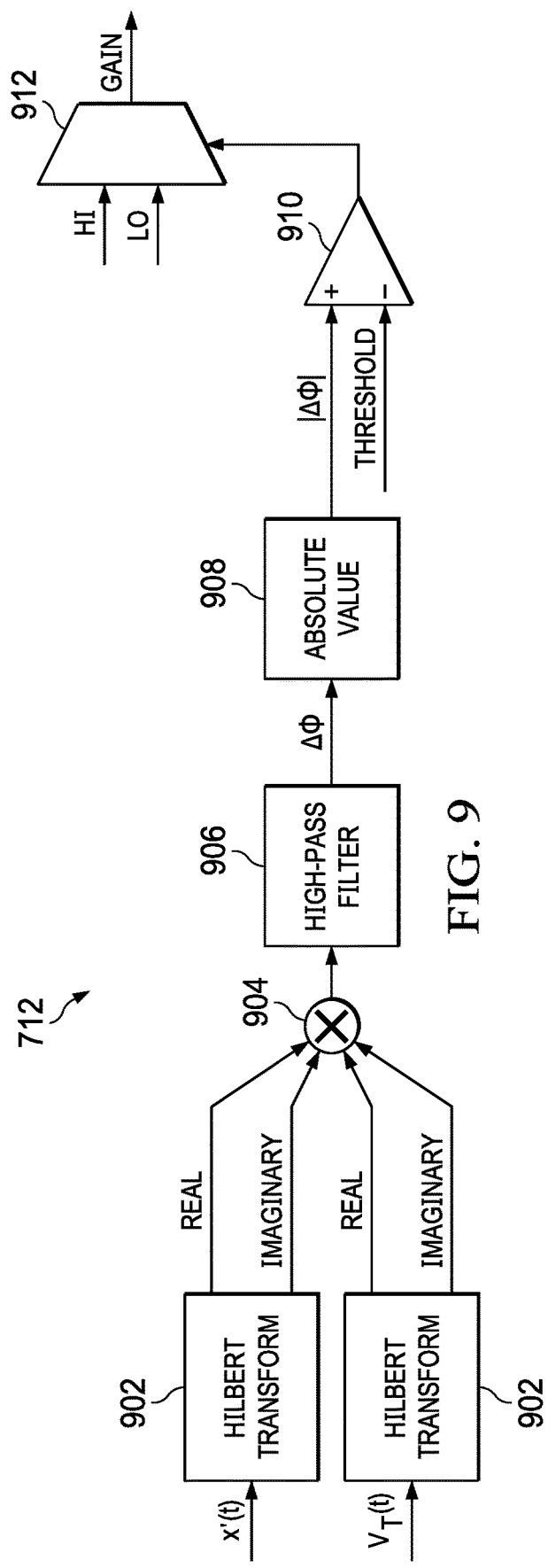
FIG. 9 illustrates a block diagram of selected components of an example instability detector, in accordance with embodiments of the present disclosure.

FIG. 9 illustrates a block diagram of selected components of an example instability detector 712, in accordance with embodiments of the present disclosure. As shown in FIG. 9, instability detector 712 may receive sensed terminal voltage $V_T(t)$ and raw transducer driving signal x'(t) and apply a Hilbert transform 902 (or any other suitable transform with similar functionality) to generate analytic signals having both real and imaginary components of sensed terminal voltage $V_T(t)$ and raw transducer driving signal x'(t). Conjugate multiplier 904 may conjugate these real and imaginary components to obtain a phase angle that represents a phase angle difference between sensed terminal voltage $V_T(t)$ and raw transducer driving signal x'(t). The signal output by conjugate multiplier 904 may be filtered by high-pass filter 906 to remove direct-current components, leaving a phase angle $\Delta\varphi$ representing the phase difference between sensed terminal voltage $V_T(t)$ and raw transducer driving signal x'(t). Absolute value block 908 may receive phase angle $\Delta\varphi$ and output phase angle magnitude $|\Delta\varphi|$. A comparator 910 may compare phase angle magnitude $|\Delta\varphi|$ to a threshold value. Based on the comparison performed by comparator 910, a multiplexer 912 may select a gain GAIN (e.g., to be applied to negative impedance Re_neg by a gain element 714 of FIG. 7). For example, when phase angle magnitude $|\Delta\varphi|$ is below the threshold value, multiplexer 912 may select a higher gain HI, but when phase angle magnitude |Δφ| is above the threshold value, multiplexer 912 may select a lower gain LO.

Although the foregoing contemplates instability control by controlling a gain applied to negative impedance Re_neg, in some embodiments, instability detector 712 may control other parameters in order to maintain feedback loop stability. For example, in addition to or in lieu of controlling a gain applied to negative impedance Re_neg, in some embodiments, instability detector 712 may control a response of negative impedance filter 726, operational parameters of amplifier 706, and/or any other parameters of system 700.

Although the foregoing discusses application to a linear electromagnetic load, it is understood that systems and methods similar or identical to those disclosed may be applied to other linear or non-linear systems.

Further, although the foregoing contemplates use of a negative resistance filter to implement a model of an LRA, in some embodiments a mathematical equivalent to an LRA may be used in lieu of a model.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A method comprising:
    receiving a first signal for driving an amplifier that drives a load;
    receiving a second signal driven by the amplifier;
    performing a first transform of the first signal into real and imaginary components;
    performing a second transform of the second signal into real and imaginary components;
    detecting instability of a feedback loop for controlling the first signal based on comparison of the first signal and the second signal, wherein the comparison of the first signal and the second signal comprises comparing a phase difference between respective phase angles of the first signal and the second signal.

2. The method of claim 1, wherein the load is a haptic transducer.

3. The method of claim 1, wherein each of the first transform and the second transform comprises a Hilbert transform.

4. The method of claim 1, further comprising performing a conjugate multiplication of the respective real and imaginary components of the first signal and the second signal to generate the phase difference.

5. The method of claim 1, further comprising modifying the first signal responsive to determining instability of the feedback loop.

6. The method of claim 1, further comprising modifying a gain of the feedback loop responsive to determining instability of the feedback loop.

7. The method of claim 1, wherein a component of the feedback loop models a virtual negative impedance to be virtually applied to at least partially offset impedance of the load, and the method further comprises modifying the virtual negative impedance responsive to determining instability of the feedback loop.

8. The method of claim 1, wherein the load comprises an electromagnetic load.

9. A system comprising:
    a first input for receiving a first signal for driving an amplifier that drives a load;
    a second input for receiving a second signal driven by the amplifier; and
    an instability detector configured to:
        perform a first transform of the first signal into real and imaginary components;
        perform a second transform of the second signal into real and imaginary components; and detect instability of a feedback loop for controlling the first signal based on comparison of the first signal and the second signal.

10. The system of claim 9, wherein the load is a haptic transducer.

11. The system of claim 9, wherein each of the first transform and the second transform comprises a Hilbert transform.

12. The system of claim 9, wherein the instability detector is further configured to perform a conjugate multiplication of the respective real and imaginary components of the first signal and the second signal to generate the phase difference.

13. The system of claim 9, wherein the instability detector is further configured to cause modification of the first signal responsive to determining instability of the feedback loop.

14. The system of claim 9, wherein the instability detector is further configured to cause modification of a gain of the feedback loop responsive to determining instability of the feedback loop.

15. The system of claim 9, wherein a component of the feedback loop models a virtual negative impedance to be virtually applied to at least partially offset impedance of the load, and the method further comprises modifying the virtual negative impedance responsive to determining instability of the feedback loop.

16. The system of claim 9, wherein the load comprises an electromagnetic load.

17. A host device comprising:
a processing subsystem comprising:
an amplifier that drives a load; and
a processing subsystem comprising:
a first input for receiving a first signal for driving the amplifier;
a second input for receiving a second signal driven by the amplifier; and
an instability detector configured to:
perform a first transform of the first signal into real and imaginary components;
perform a second transform of the second signal into real and imaginary components; and
detect instability of a feedback loop for controlling the first signal based on comparison of the first signal and the second signal.

* * * * *